(12) United States Patent
Chen et al.

(10) Patent No.: US 11,012,037 B2
(45) Date of Patent: May 18, 2021

(54) TECHNIQUES FOR CONTROLLING AN AUTO-ZERO AMPLIFIER

(71) Applicant: Analog Devices International Unlimited Company, Limerick (IE)

(72) Inventors: Hai Chen, Gilbert, AZ (US); Gregory J. Hughes, Paradise Valley, AZ (US)

(73) Assignee: Analog Devices International Unlimited Company, Limerick (IE)

( * ) Notice: Subject to any disclaimer, the term of this patent is extended or adjusted under 35 U.S.C. 154(b) by 40 days.

(21) Appl. No.: 16/361,579

(22) Filed: Mar. 22, 2019

(65) Prior Publication Data

US 2020/0304078 A1 Sep. 24, 2020

(51) Int. Cl.
*H03F 1/02* (2006.01)
*H03F 1/30* (2006.01)
*G11C 27/02* (2006.01)
*H03F 1/26* (2006.01)
*H03F 3/45* (2006.01)

(52) U.S. Cl.
CPC ........... *H03F 1/303* (2013.01); *G11C 27/026* (2013.01); *H03F 1/26* (2013.01); *H03F 3/45977* (2013.01)

(58) Field of Classification Search
CPC ............. H03F 1/303; H03F 3/005; H03F 3/45
USPC ...................... 330/9; 327/124, 307
See application file for complete search history.

(56) References Cited

U.S. PATENT DOCUMENTS

| | | | |
|---|---|---|---|
| 4,190,805 A * | 2/1980 | Bingham | G01R 17/00 330/51 |
| 4,345,477 A | 8/1982 | Johnson | |
| 4,808,942 A * | 2/1989 | Milkovic | H03F 1/303 330/51 |
| 5,047,727 A | 9/1991 | Theus | |
| 5,258,664 A | 11/1993 | White | |
| 5,497,123 A | 3/1996 | Main et al. | |
| 5,663,680 A | 9/1997 | Nordeng | |
| 6,271,784 B1 | 8/2001 | Lynn et al. | |
| 6,653,895 B1 | 11/2003 | Botker | |
| 8,493,139 B2 | 7/2013 | Sayuk | |
| 8,698,556 B2 | 4/2014 | Rosca | |
| 9,444,414 B2 | 9/2016 | Peluso | |
| 10,833,639 B2 | 11/2020 | Chen et al. | |

(Continued)

FOREIGN PATENT DOCUMENTS

| | | | |
|---|---|---|---|
| CN | 111726087 A | 9/2020 | |
| EP | 0433383 B1 | 10/1994 | |

(Continued)

OTHER PUBLICATIONS

Kugelstadt, Thomas, "Auto-zero amplifiers ease the design of high-precision circuits", Analog Applications Journal, Texas Instruments Inc., (2005), 10 pgs.

Moghimi, Reza, "To Chop or Auto-Zero: That is the Question", Analog Devices Technical Article, MS-2062, (Jun. 2011), 6 pgs.

Moghimi, Reza, "Zero-Drift Operational Amplifiers", Analog Dialog 44-03 Back Burner, (Mar. 2010), 2 pgs.

(Continued)

*Primary Examiner* — Steven J Mottola
(74) *Attorney, Agent, or Firm* — Schwegman Lundberg & Woessner, P.A.

(57) ABSTRACT

This disclosure describes auto-zero amplifier circuit that include an additional capacitor (or other capacitive component) that can be switchably coupler to a reference voltage. The auto-zero amplifier circuit can generate an auto-zero compensation signal using a difference between the reference voltage stored on the additional capacitor and a voltage stored on another auto-zero capacitor.

19 Claims, 3 Drawing Sheets

(56) References Cited

U.S. PATENT DOCUMENTS

| | | |
|---|---|---|
| 2007/0013439 A1 | 1/2007 | Gutzki et al. |
| 2008/0018392 A1 | 1/2008 | Nolan et al. |
| 2008/0042742 A1 | 2/2008 | Linder et al. |
| 2008/0079413 A1 | 4/2008 | Ashburn et al. |
| 2009/0009240 A1 | 1/2009 | Takemoto et al. |
| 2012/0249243 A1 | 10/2012 | Rosca |
| 2020/0328723 A1 | 10/2020 | Chen et al. |

FOREIGN PATENT DOCUMENTS

| | | |
|---|---|---|
| EP | 2363953 B1 | 10/2012 |
| EP | 1992067 B1 | 4/2017 |
| EP | 2779444 B1 | 12/2017 |
| EP | 3713083 A1 | 9/2020 |

OTHER PUBLICATIONS

Nolan, Eric, et al., "Demystifying Auto-Zero Amplifiers-2", Analog Dialogue 34-3, (2000), 2 pgs.

Nolan, Eric, "Demystifying Auto-Zero Amplifiers—Part 1", Analog Dialogue 34-2, (2000), 3 pgs.

"U.S. Appl. No. 16/382,627, Notice of Allowance dated Jul. 24, 2020", 8 pgs.

"Chinese Application Serial No. 202010152133.6, Notification to Make Rectification dated Apr. 10, 2020", w/o English Translation. 1 pg.

"European Application Serial No. 20161067.2, Extended European Search Report dated Aug. 18, 2020", 9 pgs.

"European Application Serial No. 20161067.2, Response filed Mar. 22, 2021 to Extended European Search Report dated Aug. 18, 2020", 22 pgs.

\* cited by examiner

TECHNIQUES FOR CONTROLLING AN AUTO-ZERO AMPLIFIER

FIELD OF THE DISCLOSURE

This document pertains generally, but not by way of limitation, to operational amplifiers and, more particularly, to auto-zero amplifiers.

BACKGROUND

CMOS technology produces switches and capacitors with high performance and yield. CMOS operational amplifiers ("op amps"), however, can suffer from several drawbacks. More example, CMOS op amps typically have input offset voltages within the range of 1-10 millivolts (mV), whereas ideally the input offset voltage should be zero. During operation, the difference between the voltages on the input terminals of the op amp is equal to the input offset voltage when the output voltage is at zero volts. In addition, such op amps typically have a finite gain within the range of 100-1,000,000 (though ideally the gain should be infinite). As a result of the finite gain, there can exist an additional error voltage between the op amp input terminals that varies as the output voltage varies, which can cause inaccurate performance. Therefore, CMOS op amps can significantly adversely affect the accuracy of the circuit in which they are used.

SUMMARY OF THE DISCLOSURE

Using various techniques of this disclosure, an additional capacitor (or other capacitive component) can be added to an auto-zero circuit and can be switchably coupled to a reference voltage. Then, the auto-zero amplifier circuit can generate an auto-zero compensation signal using a difference between the reference voltage stored on the additional capacitor and a voltage stored on another auto-zero capacitor. Using an additional capacitor in the auto-zero circuit to store the reference voltage to generate the compensation signal can negate the effects of leakage due to temperature variation and/or noise coupling.

In some aspects, this disclosure is directed to an auto-zero amplifier circuit to compensate for offset drift. The circuit comprises a first amplifier circuit having a first input offset voltage; a first auto-zero capacitor configured to be switchably coupled to the first amplifier circuit using a first switch, the first auto-zero capacitor configured to store the first input offset voltage; and a second auto-zero capacitor configured to be switchably coupled using a second switch to a first reference voltage to store the first reference voltage, wherein the first amplifier circuit is configured to generate a first amplifier circuit compensation signal using a difference between the first input offset voltage stored on the first auto-zero capacitor and the first reference voltage stored on the second auto-zero capacitor.

In some aspects, this disclosure is directed to a method of compensating an auto-zero amplifier circuit for offset drift. The method comprises coupling, using a first switch, a first auto-zero capacitor to a first amplifier circuit to store a first input offset voltage of the first amplifier circuit; coupling, using a second switch, a second auto-zero capacitor to a first reference voltage to store the first reference voltage; and generating a first compensation signal using a difference between the first input offset voltage stored on the first auto-zero capacitor and the first reference voltage stored on the second auto-zero capacitor.

In some aspects, this disclosure is directed to an auto-zero amplifier circuit to compensate for offset drift. The circuit comprises a first amplifier circuit having a first input offset voltage; means for storing a first input offset voltage of the first amplifier circuit; means for storing a first reference voltage, wherein the first amplifier circuit is configured to generate a first amplifier circuit compensation signal using a difference between the stored first input offset voltage and the stored first reference voltage.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

To compensate for the non-ideal performance of CMOS or BJT operational amplifiers, auto-zeroing features can reduce offset voltage and gain errors. Due to various factors, such as temperature variation and/or noise coupling, the offset voltage of an operational amplifier can drift over time. The present inventors have recognized a need to be able to improve the immunity of the operational amplifier to offset drift due to temperature variation and noise coupling, for example.

Using various techniques of this disclosure, an additional capacitor (or other capacitive component) can be added to an auto-zero circuit and can be switchably coupled to a reference voltage. Then, the auto-zero amplifier circuit can generate an auto-zero compensation signal using a difference between the reference voltage stored on the additional capacitor and a voltage stored on another auto-zero capacitor. The present inventors have recognized that by using an additional capacitor in the auto-zero circuit to store the reference voltage to generate the compensation signal, rather than using the reference voltage directly to generate the compensation signal, the additional capacitor can leak current at a rate and in a manner similar to the auto-zero capacitor, which can negate the effects of the leakage due to the temperature variation and/or noise coupling.

Figure 1A:
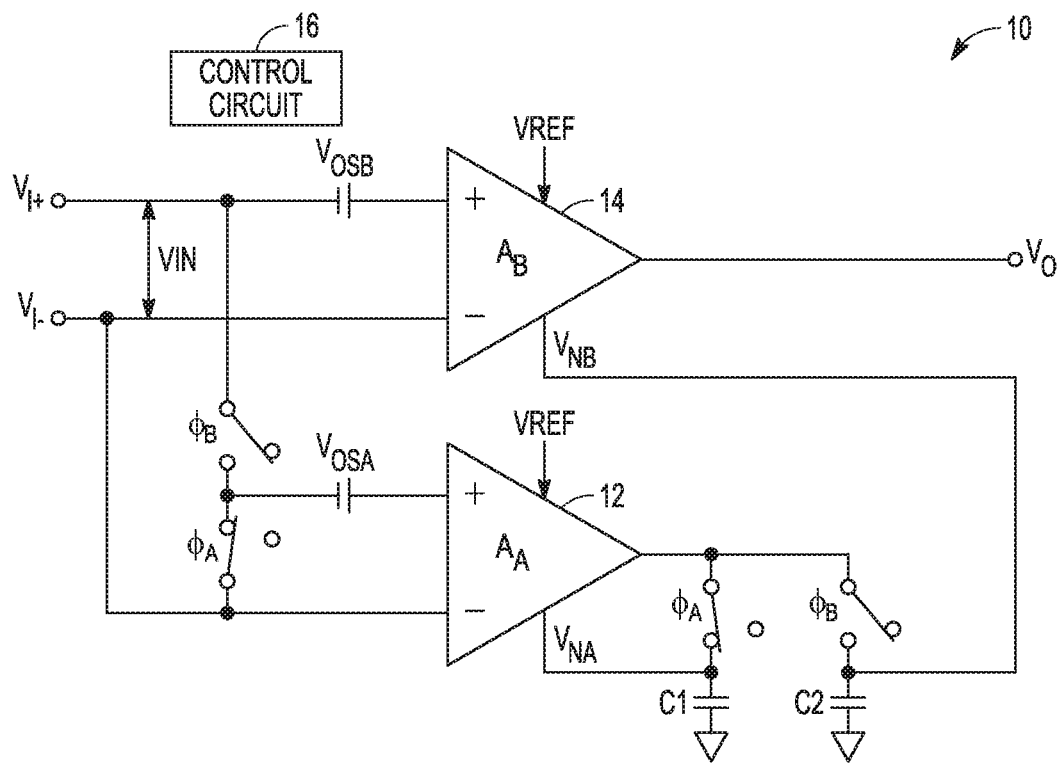
FIGS. 1A and 1B are schematic diagrams of an example of auto-zero amplifier circuit.
Figure 1B:
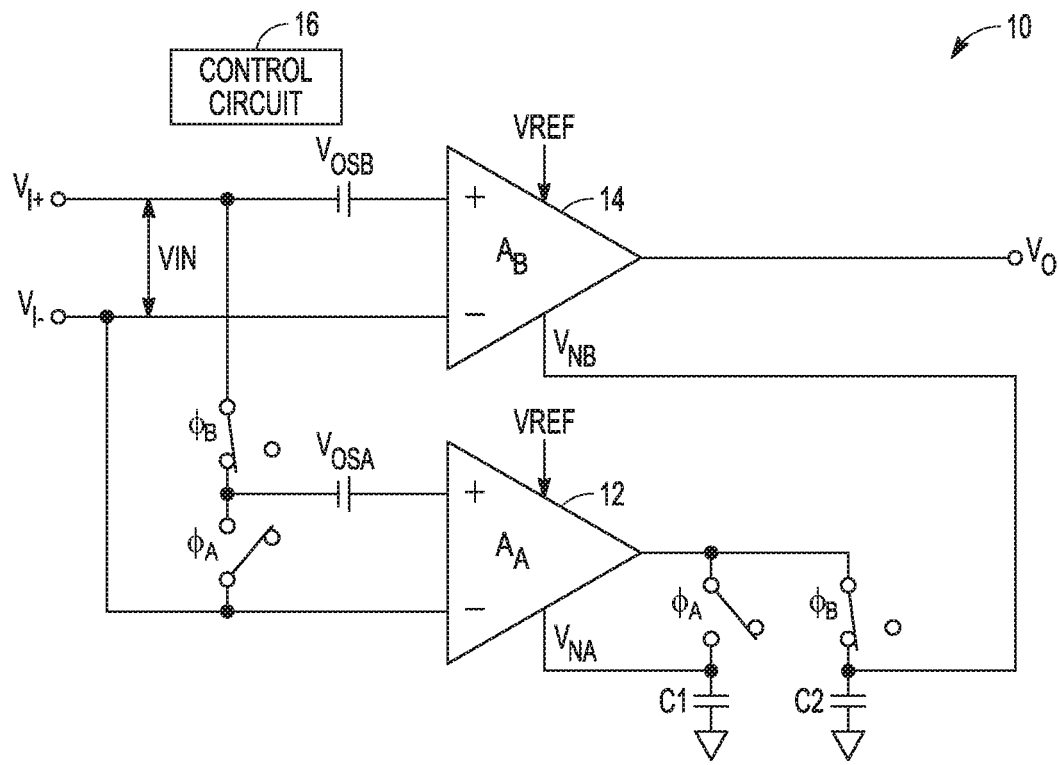

FIGS. 1A and 1B are schematic diagrams of an example of auto-zero amplifier circuit. FIG. 1A depicts the example of an auto-zero amplifier circuit 10 in a first phase and FIG. 1B depicts the example of the auto-zero amplifier circuit 10 in a second phase. The auto-zero amplifier 10 of FIGS. 1A and 1B can include a nulling amplifier circuit 12, a main amplifier circuit 14, $\phi_A$ switches that close in a first phase (Phase A) and open in a second phase (Phase B), and complementary $\phi_B$ switches that open in the first phase (Phase A), and close in the second phase (Phase B). A control circuit 16 can include an oscillator and can control operation of the $\phi_A$ switches and the $\phi_B$ switches. The nulling amplifier 12 has an offset voltage of $V_{OSA}$ and the main amplifier 14 has an offset voltage of $V_{OSB}$. The amplifier circuit 10 can receive a differential input signal $V_{I+}$ and $V_{I-}$ and generate an output signal $V_O$.

In the first (or nulling) phase (Phase A) shown in FIG. 1A, the $\phi_A$ switches are closed (and the $\phi_B$ switches are opened) and the differential input signal $V_{I+}$ and $V_{I-}$ is applied to the main amplifier 14. In the nulling phase, the inputs of the nulling amplifier 12 are shorted together and to the inverting input terminal (common mode input voltage) of the nulling amplifier 12. The nulling amplifier 12 nulls its own offset voltage $V_{OSA}$ by feeding back to its nulling terminal whatever opposing voltage $V_{NA}$ is required to make the product of that voltage and the incremental gain of the nulling input approximately equal to the input offset voltage $V_{OSA}$ of the nulling amplifier 12. The nulling voltage is also stored on a first auto-zero capacitor C1. The auto-zero capacitor C1 is configured to store the input offset voltage $V_{OSA}$ and be switchably coupled to the nulling amplifier 12 using a $\phi_A$ switch. Meanwhile, the main amplifier 14 operates like a normal op amp. The nulling voltage of the main amplifier 14 is supplied by the voltage stored on a second auto-zero capacitor C2. The auto-zero capacitor C2 is configured to store the input offset voltage $V_{OSB}$ and be switchably coupled to the main amplifier 14 using a $\phi_B$ switch.

During the second (or output) phase (Phase B) shown in FIG. 1B, the $\phi_B$ switches are closed (and the $\phi_A$ switches are opened) and the inputs of the nulling amplifier 12 are connected to the input terminals of the main amplifier 14, which couples the differential input signal $V_{I+}$ and $V_{I-}$ to the inputs of the nulling amplifier 12. The auto-zero capacitor C1 continues to supply the nulling amplifier's required offset correction voltage. The differential input signal $V_{I+}$ and $V_{I-}$ is amplified by the nulling amplifier 12 and is further amplified by the incremental gain of the main amplifier's nulling input circuitry. The differential input signal $V_{I+}$ and $V_{I-}$ is also directly amplified by the gain of the main amplifier 14 itself.

The op amp feedback will cause the output voltage of the nulling amplifier 12 to be whatever voltage $V_{NB}$ is necessary at the main amplifier's nulling input to bring the main amplifier's input difference voltage to near-null. The output of the nulling amplifier 12 is also stored on the second auto-zero capacitor C2, which can hold that required voltage during the next Phase A. In Phase B, with its nulling voltage furnished by the first auto-zero capacitor C1, the nulling amplifier 12 amplifies the differential input signal $V_{I+}$ and $V_{I-}$ applied to the main amplifier 14 and applies the amplified voltage to the nulling input of the main amplifier and the capacitor C2.

To correct its offset voltage $V_{OSA}$, the nulling amplifier 12 can generate a nulling amplifier compensation signal using a difference between the voltage $V_{NA}$ applied at its nulling terminal and a reference voltage $V_{REF}$. Similarly, to correct its offset voltage $V_{OSB}$, the main amplifier 14 can generate a main amplifier compensation signal using a difference between the voltage $V_{NB}$ applied at its nulling terminal and a reference voltage $V_{REF}$.

Due to various factors, such as temperature variation and/or noise coupling, the offset voltage of an operational amplifier can drift over time. For example, as the temperature increases, the auto-zero capacitor C1 can leak in phase B and the auto-zero capacitor C2 can leak in phase A, which can cause offset voltage drift. The present inventors have recognized a need to be able to improve the immunity of the operational amplifier to offset drift.

As described below, the present inventors have recognized that by using one or more additional capacitors in the auto-zero circuit to store a reference voltage to generate the compensation signal, rather than using the reference voltage directly to generate the compensation signal, the additional capacitor can leak current at a rate and in a manner similar to the auto-zero capacitor, which can negate the effects of the leakage due to the temperature variation and/or noise coupling.

Figure 2:
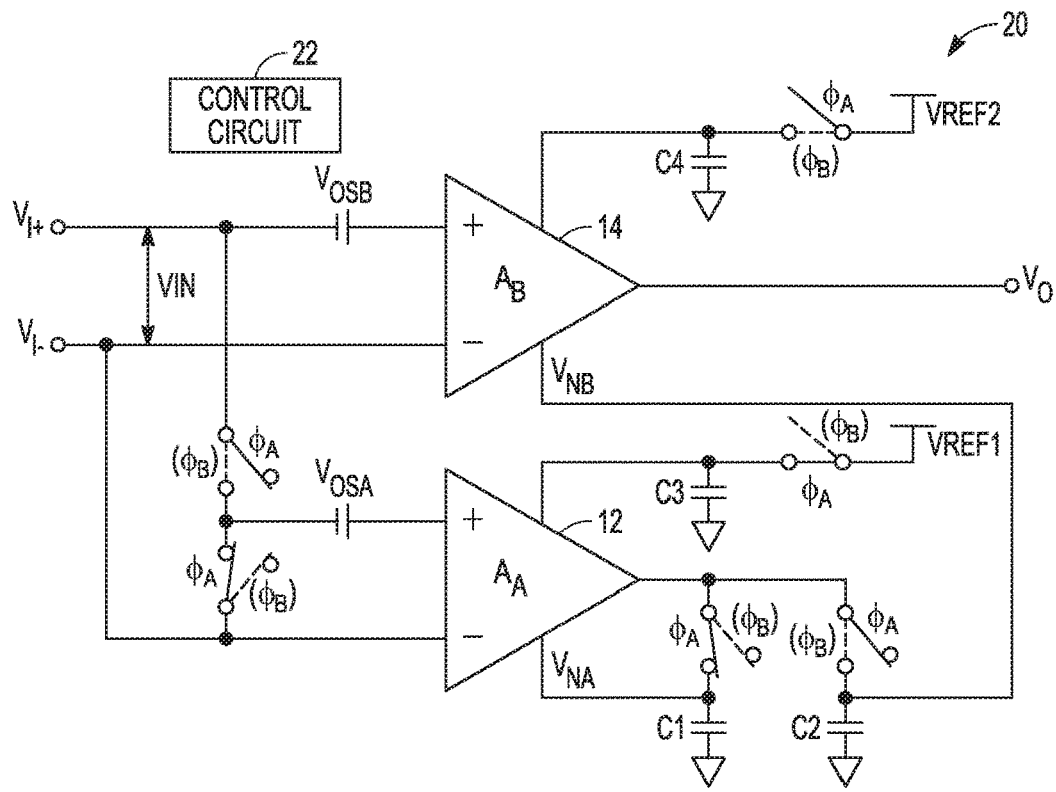
FIG. 2 is a schematic diagram of an example of an auto-zero amplifier circuit with improved immunity to offset drift.

FIG. 2 is a schematic diagram of an example of an auto-zero amplifier circuit with improved immunity to offset drift. The auto-zero amplifier 20 of FIG. 2 can include a nulling amplifier circuit 12, a main amplifier circuit 14, $\phi_A$ switches that close in a first phase (Phase A) and open in a second phase (Phase B), and $\phi_B$ switches that open in the first phase (Phase A), and close in the second phase (Phase B). A control circuit 22 can include an oscillator and can control operation of the $\phi_A$ switches and the $\phi_B$ switches. The nulling amplifier 12 has an offset voltage of $V_{OSA}$ and the main amplifier 14 has an offset voltage of $V_{OSB}$. The amplifier circuit 10 can receive a differential input signal $V_{I+}$ and $V_{I-}$ and generate a single-ended output signal $V_O$, for example. Components in FIG. 2 that are similar to components in FIGS. 1A and 1B are labeled with similar reference numbers and, for purposes of conciseness, will not be described in detail again. The amplifier circuits in this disclosure can be implemented using CMOS operational amplifiers or bipolar operational amplifiers.

The circuit 20 of FIG. 2 further includes two additional auto-zero capacitors, namely capacitors C3 and C4. The operation of the switches coupled to auto-zero capacitors C1 and C3 can be complementary to the operation of the switches coupled to auto-zero capacitors C2 and C4.

During phase A, the control circuit 22 can control the $\phi_A$ and $\phi_B$ switches to couple the auto-zero capacitor C3 to a first reference voltage VREF1 and decouple the auto-zero capacitor C4 from a second reference voltage VREF2. During phase A, the auto-zero capacitor C3 can be charged to the first reference voltage VREF1. In this manner, the auto-zero capacitor C3 can store the first reference voltage VREF1, e.g., like a "sample and hold" operation. As described above with respect to FIG. 1A, the input offset voltage for the nulling amplifier 12 is stored on the auto-zero capacitor C1.

During phase B, the control circuit 22 can control the $\phi_A$ and $\phi_B$ switches to decouple the auto-zero capacitor C3 from the first reference voltage VREF1 and couple the auto-zero capacitor C4 to the second reference voltage VREF2. The input offset voltage of the auto-zero capacitor C1 is applied to the nulling input of the nulling amplifier 12. In addition, the first reference voltage VREF1 that was stored on the auto-zero capacitor C3 is applied to a reference voltage input of the nulling amplifier 12. The nulling amplifier 12 is configured to generate an amplifier circuit compensation signal using a difference between the input offset voltage (stored on the auto-zero capacitor C1) and the first reference voltage VREF1 (stored on the auto-zero capacitor C3). The nulling amplifier 12 can use the compensation signal to generate an error signal that can be injected into various nodes within the nulling amplifier circuitry to correct for the offset.

During phase B, the auto-zero capacitor C4 can be charged to the second reference voltage VREF2. In this manner, the auto-zero capacitor C4 can store the second reference voltage VREF2. As described above with respect to FIG. 1A, the input offset voltage for the main amplifier 14 is stored on the auto-zero capacitor C2.

During the next phase A, the control circuit 22 can control the $\phi_A$ and $\phi_B$ switches to couple the auto-zero capacitor C3 to the first reference voltage VREF1 and decouple the auto-zero capacitor C4 from the second reference voltage VREF2. The input offset voltage of the auto-zero capacitor C2 is applied to the nulling input of the main amplifier 14. In addition, the second reference voltage VREF2 that was stored on the auto-zero capacitor C4 can be applied to a reference voltage input of the main amplifier 14. The main amplifier 14 is configured to generate another amplifier circuit compensation signal using a difference between the input offset voltage (stored on the auto-zero capacitor C2) and the second reference voltage VREF1 (stored on the auto-zero capacitor C4). The main amplifier 14 can use the compensation signal to generate an error signal that can be injected into various nodes within the nulling amplifier circuitry to correct for the offset.

By storing the reference voltages on the additional capacitors C3, C4 and using those stored voltages to generate the compensation signal, rather than using the reference voltage directly to generate the compensation signal, the additional capacitors C3, C4 can leak current at a rate and in a manner similar to the auto-zero capacitors C1, C2 to negate the effects of the leakage, e.g., due to the temperature variation, noise coupling, etc. In some example implementations, the capacitance of the capacitor C3 can be substantially equal to the capacitance of the capacitor C1, and the capacitance of the capacitor C4 can be substantially equal to the capacitance of the capacitor C2.

In some example configurations, the reference voltages VREF1 and VREF2 can be the same reference voltage. In other example configurations, the reference voltages VREF1 and VREF2 can be different reference voltages.

In some examples implementations, the amplifier circuit can be a differential input and single-ended out configuration, such as shown in FIG. 2, where an output terminal is referenced to ground. The techniques of this disclosure are also applicable to a differential input and differential output configuration, such as shown in FIG. 3.

Figure 3:
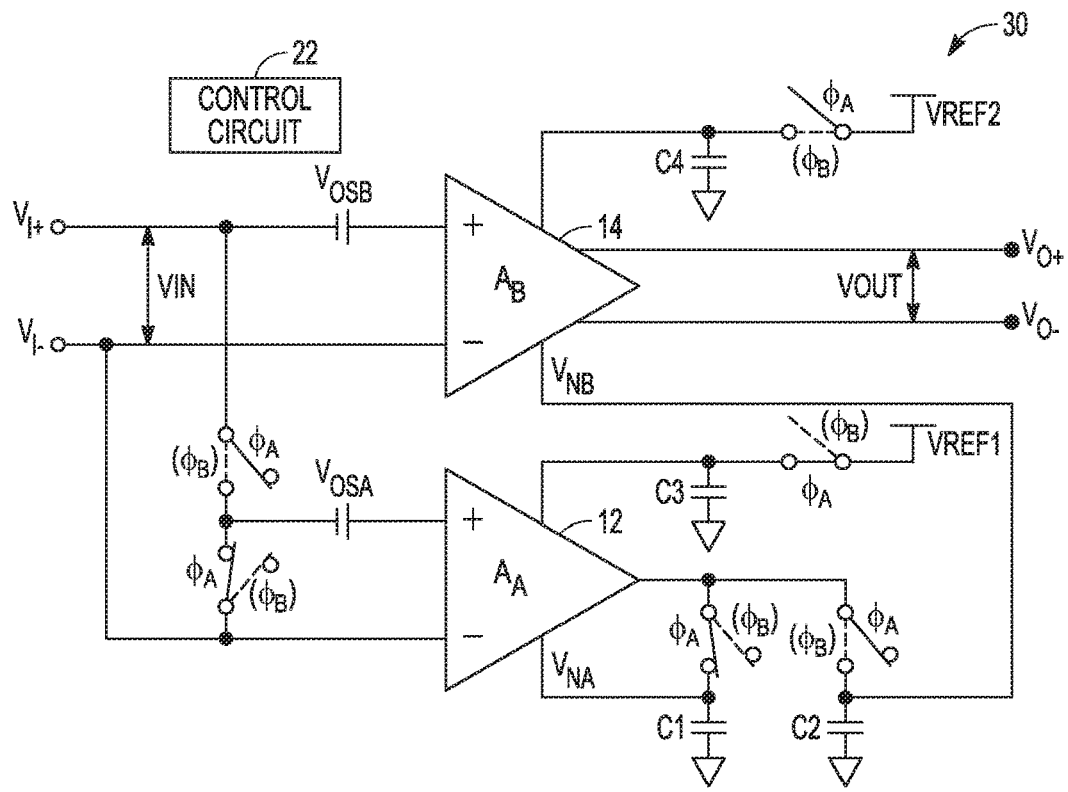
FIG. 3 is a schematic diagram of another example of an auto-zero amplifier circuit with improved immunity to offset drift.

FIG. 3 is a schematic diagram of another example of an auto-zero amplifier circuit with improved immunity to offset drift. The auto-zero amplifier circuit 30 of FIG. 3 is a fully differential configuration. The auto-zero amplifier circuit 30 includes two output terminals $V_{O+}$ and $V_{O-}$. The amplifier circuit 30 can receive a differential input signal $V_{I+}$ and $V_{I-}$ and generate an output signal $V_{OUT}$ between the two output terminals $V_{O+}$ and $V_{O-}$.

Although described above with respect to FIG. 2 as including two amplifier circuits, e.g., the nulling amplifier 12 and the main amplifier 14, the techniques of this disclosure are not limited to such configurations. Rather, an auto-zero amplifier circuit having a single amplifier circuit can implement various techniques of this disclosure, as shown in FIG. 4.

Figure 4:
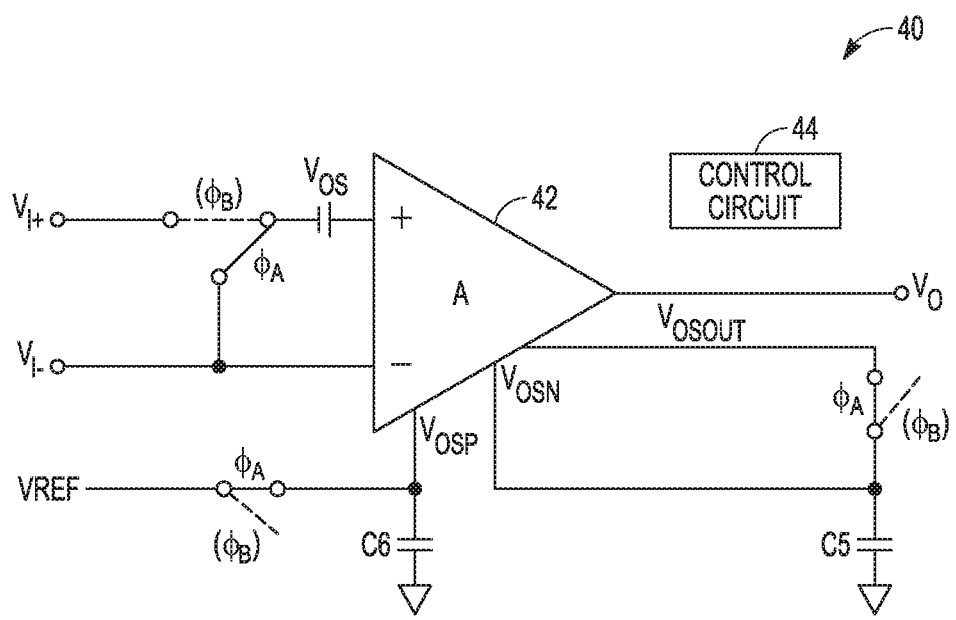
FIG. 4 is a schematic diagram of another example of an auto-zero amplifier circuit with improved immunity to offset drift.

FIG. 4 is a schematic diagram of another example of an auto-zero amplifier circuit with improved immunity to offset drift. The auto-zero amplifier circuit 40 includes a single amplifier circuit 42, and switches that close in a first phase (Phase A, $\phi_A$) and open in a second phase (Phase B, $\phi_B$). The auto-zero amplifier circuit 40 can include two auto-zero capacitors C5 and C6. In some example implementations, the capacitance of the capacitor C6 can be substantially equal to the capacitance of the capacitor C5.

A control circuit 44 can include an oscillator and can control operation of the switches. The auto-zero amplifier circuit 40 can receive a differential input signal $V_{I+}$ and $V_{I-}$ and generate an output signal $V_O$ in the differential input, singled-ended output configuration of FIG. 4. In some example implementations, the amplifier circuit 40 can be implemented in a differential input, differential output configuration, such as shown in FIG. 3.

During phase A, the amplifier 42 is in its nulling period and can generate an offset compensation voltage $V_{OSOUT}$ to compensate for the offset voltage $V_{OS}$ present at the input terminals. The control circuit 44 can control switches to close ($\phi_A$ position) and the auto-zero amplifier circuit 40 can store the offset compensation voltage $V_{OSOUT}$ on the auto-zero capacitor C5. With the switches closed, the auto-zero capacitor C6 can be coupled to the reference voltage VREF. During phase A, the auto-zero capacitor C6 can be charged to the reference voltage VREF. In this manner, the auto-zero capacitor C6 can store the reference voltage VREF1, e.g., like a "sample and hold" operation. During phase A, the output signal $V_O$ is not valid.

During phase B, the control circuit 44 can control the switches to open ($\phi_B$ position). With the switches open, the voltage on the auto-zero capacitor C5 can be applied to a first nulling terminal $V_{OSN}$ of the amplifier 24 and the voltage on the auto-zero capacitor C6 can be applied to a second nulling terminal $V_{OSP}$ of the amplifier 42. Then, the amplifier circuit 42 can generate an auto-zero compensation signal using a difference between the reference voltage stored on the auto-zero capacitor C6 and the offset compensation voltage $V_{OSOUT}$ stored on the auto-zero capacitor C5. The output signal $V_O$ represents the signal amplified by the differential signal ($V_{I+}$ minus $V_{I-}$) with the offset of the amplifier circuit 42 compensated by the capacitors C5 and C6.

By storing the reference voltage on the additional capacitor C6 and using that stored voltage to generate the compensation signal, rather than using the reference voltage directly to generate the compensation signal, the additional capacitor C6 can leak current at a rate and in a manner similar to the auto-zero capacitor C5 to negate the effects of the leakage, e.g., due to the temperature variation, noise coupling, etc.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An auto-zero amplifier circuit to compensate for offset drift, and generate an output signal, the circuit comprising:
   a first amplifier circuit having a first input offset voltage;
   a second amplifier circuit having a second input offset voltage;
   a first auto-zero capacitor switchably coupled, using a first switch, to the first amplifier circuit to receive and store a first reference voltage;
   a second auto-zero capacitor switchably coupled, using a second switch, to the second amplifier circuit to receive and store the first input offset voltage,
   wherein the first amplifier circuit is coupled to generate a first amplifier circuit compensation signal using a difference between the first input offset voltage and the first reference voltage;
   a third auto-zero capacitor switchably coupled, using a third switch, to the second amplifier circuit to receive and store the second input offset voltage; and
   a fourth auto-zero capacitor switchably coupled, using a fourth switch, to the second amplifier circuit to receive and store a second reference voltage,
   wherein the second amplifier circuit is coupled to generate a second compensation signal using a difference between the second input offset voltage stored on the third auto-zero capacitor and the second reference voltage stored on the fourth auto-zero capacitor, and
   wherein an output of the second amplifier circuit is coupled to a nulling input of the first amplifier circuit, and an output of the first amplifier circuit to generate the output signal.

2. The auto-zero amplifier circuit of claim 1, wherein the first amplifier circuit is coupled to receive a differential input signal, and wherein the output signal is a single-ended output signal.

3. The auto-zero amplifier circuit of claim 1, wherein the first auto-zero capacitor and the second auto-zero capacitor have the same capacitance.

4. The auto-zero amplifier circuit of claim 1, wherein the first amplifier circuit is coupled to receive a differential input signal, and wherein the output signal is a differential output signal.

5. The auto-zero amplifier circuit of claim 1, wherein the first reference voltage is equal to the second reference voltage.

6. The auto-zero amplifier circuit of claim 1, wherein the first auto-zero capacitor and the second auto-zero capacitor have the same capacitance, and wherein the third auto-zero capacitor and the fourth auto-zero capacitor have the same capacitance.

7. The auto-zero amplifier circuit of claim 1, further comprising:
   a control circuit including an oscillator and coupled to control operation of the first, second, third, and fourth switches, wherein an operation of the first and second switches is complementary to an operation of the third and fourth switches.

8. The auto-zero amplifier circuit of claim 1, further comprising:
   a fifth switch coupled to connect first and second inputs of the first amplifier circuit to generate the first offset voltage at the output of the first amplifier circuit.

9. A method of compensating an auto-zero amplifier circuit for offset drift and generate an output signal, the method comprising:

coupling, using a first switch, a first auto-zero capacitor to a first amplifier circuit to receive and store a first reference voltage;

coupling, using a second switch, a second auto-zero capacitor to a second amplifier circuit to receive and store a first input offset voltage of the first amplifier circuit; and generating a first compensation signal using a difference between the first input offset voltage and the first reference voltage, coupling, using a third switch, a third auto-zero capacitor to the second amplifier circuit to receive and store a second input offset voltage of the second amplifier circuit;

coupling, using a fourth switch, a fourth auto-zero capacitor to the second amplifier circuit to receive and store a second reference voltage;

generating a second compensation signal using a difference between the second input offset voltage and the second reference voltage;

coupling an output of the second amplifier circuit to a nulling input of the first amplifier circuit; and generating the output signal using an output of the first amplifier circuit.

10. The method of claim 9, further comprising:
receiving a differential input signal and generating a single-ended output signal.

11. The method of claim 9, further comprising:
receiving a differential input signal and generating a differential output signal.

12. The method of claim 9, wherein the first auto-zero capacitor and the second auto-zero capacitor have the same capacitance.

13. The method of claim 9, wherein the first reference voltage is equal to the second reference voltage.

14. The method of claim 9, further comprising:
connecting, using a fifth switch, first and second inputs of the first amplifier circuit to generate the first offset voltage at an output of the first amplifier circuit.

15. An auto-zero amplifier circuit to compensate for offset drift and generate an output signal, the circuit comprising:
a first amplifier circuit having a first input offset voltage;
means for storing a first input offset voltage of the first amplifier circuit;
means for storing a first reference voltage,
wherein the first amplifier circuit is coupled to generate a first amplifier circuit compensation signal using a difference between the stored first input offset voltage and the stored first reference voltage,
a second amplifier circuit having a second input offset voltage;
means for storing the second input offset voltage; and
means for storing a second reference voltage,
wherein the second amplifier circuit is coupled to generate a second compensation signal using a difference between the stored second input offset voltage and the stored second reference voltage,
wherein an output of the second amplifier circuit is coupled to a nulling input of the first amplifier circuit, and an output of the first amplifier circuit to generate the output signal.

16. The auto-zero amplifier circuit of claim 15, wherein the first amplifier circuit is coupled to receive a differential input signal, and wherein the output signal is a differential output signal.

17. The auto-zero amplifier circuit of claim 15, wherein the first amplifier circuit is coupled to receive a differential input signal, and wherein the output signal is a single-ended output signal.

18. The auto-zero amplifier circuit of claim 15, wherein the first reference voltage is equal to the second reference voltage.

19. The auto-zero amplifier circuit of claim 1, wherein the first reference voltage is not equal to the second reference voltage.

* * * * *